(12) United States Patent
Mackenzie et al.

(10) Patent No.: US 8,709,529 B2
(45) Date of Patent: Apr. 29, 2014

(54) OPTOELECTRONIC DEVICES AND A METHOD FOR PRODUCING THE SAME

(75) Inventors: J. Devin Mackenzie, San Carlos, CA (US); Ana Claudia Arias, San Carlos, CA (US); Richard Henry Friend, Cambridge (GB); Wilhelm Huck, Comberton (GB)

(73) Assignee: Cambridge Enterprise Ltd, Cambridge (GB)

( * ) Notice: Subject to any disclaimer, the term of this patent is extended or adjusted under 35 U.S.C. 154(b) by 0 days.

(21) Appl. No.: 13/242,305

(22) Filed: Sep. 23, 2011

(65) Prior Publication Data
US 2012/0064652 A1   Mar. 15, 2012

Related U.S. Application Data

(62) Division of application No. 10/474,814, filed as application No. PCT/GB02/01723 on Apr. 12, 2002, now Pat. No. 8,049,406.

(30) Foreign Application Priority Data

Apr. 12, 2001 (GB) .................................. 0109295.6

(51) Int. Cl.
*B05D 7/00*   (2006.01)
(52) U.S. Cl.
USPC .......................................................... 427/66
(58) Field of Classification Search
USPC .......................................................... 427/64
See application file for complete search history.

(56) References Cited

U.S. PATENT DOCUMENTS

| 5,670,791 | A | 9/1997 | Halls et al. |
|---|---|---|---|
| 5,895,717 | A | 4/1999 | Cao et al. |
| 6,117,567 | A | 9/2000 | Andersson et al. |
| 6,529,252 | B2 * | 3/2003 | Nakao et al. ............... 349/86 |
| 6,558,219 | B1 * | 5/2003 | Burroughes et al. ........... 445/24 |
| 6,674,136 | B1 * | 1/2004 | Ohtani ........................ 257/408 |
| 2002/0130605 | A1 * | 9/2002 | Mueller et al. ............... 313/310 |

FOREIGN PATENT DOCUMENTS

| JP | 10500441 A | 1/1998 |
|---|---|---|
| JP | 2000109824 A | 4/2000 |
| JP | 2000215987 A | 8/2000 |
| WO | 00/00854 A1 | 1/2000 |
| WO | 01/95403 A1 | 12/2001 |

OTHER PUBLICATIONS

Rogers et al., Applied Physics Letters, vol. 73, No. 3, Jul. 20, 1998, pp. 294-296.
Structure Formation via Polymer Demixing in Spin-Cast Films, Stefan Walheim et al., Macromolecules 1997, vol. 30, pp. 4995-5003.

(Continued)

*Primary Examiner* — Robert Vetere
(74) *Attorney, Agent, or Firm* — Sughrue Mion, PLLC

(57) ABSTRACT

A light-emissive device comprising a light-emissive material provided between first and second electrodes such that charge carriers can move between the first and second electrodes and the light-emissive material, wherein the device includes a layer of a polymer blend provided between the first and second electrodes, phase separation of the polymers in the polymer blend having been induced in at least a portion of the polymer blend so as to control the propagation of light emitted by the light-emissive material in a predetermined direction.

9 Claims, 3 Drawing Sheets

(56) References Cited

OTHER PUBLICATIONS

Optical and Morphological Investigations of Non-Homogeneity in Polyfluorene Blends, Martin Boltau, et al., Feb. 26, 1998, pp. 877-879 Nature.

Photodiodes Based on Polyfluorene Composites: Influence of Morphology, Jonathan J.M. Halls., et al., Adv. Mater. 2000, 12, vol. No. 7, pp. 498-502.

Patterning of Polymer Light-Emitting Diodes With Soft Lithography, Thomas Granlund, et al., Adv. Mater. 2000, 12. No. 4 pp. 269-273.

Efficient Photodiodes Form Interpenetrating Polymer Networks, J.J. M. Halls, et al., Nature vol. 376, Aug. 10, 1995, pp. 498-500.

Trapping Light in Polymer Photodiodes With Soft EM bassed Grating, Lucimara Stolz Roman, et al., Adv. Mater. 2000, 12, No. 3, pp. 189-195.

Nanophase-Separated Polymer Films As High-Performance Antireflection Coatings, Stefan Walheim, et al., Science, vol. 283, Jan. 22, 1999, pp. 520-522.

Phase Decomposition in Polymer Blend Films Cast on Substrates Patterned With Self-Assembled Monolayers, Stefan Walheim et al., Vacuum 63(2001), pp. 307-313.

Christian Kallinger, et al., A Flexible conjugated Polymer Laser, Advanced Materials, 1998, 10, No. 12, pp. 920-923; Date: 1998.

A.M. HIggins, et al., Anisotropic spinodal dewetting as a route to self-assembly of patterned surfaces, Nature, vol. 404, pp. 476-478, Date 2000.

* cited by examiner

OPTOELECTRONIC DEVICES AND A METHOD FOR PRODUCING THE SAME

CROSS-REFERENCE TO RELATED APPLICATIONS

This is a divisional of application Ser. No. 10/474,814, now U.S. Pat. No. 8,049,406, filed Jun. 15, 2004, which is a National Stage of International Application No. PCT/GB02/01723 filed Apr. 12, 2002, claiming priority based on GB Patent Application No. 0109295.6 filed Apr. 12, 2001, the contents of all of which are incorporated herein by reference in their entirety.

BACKGROUND

1. Field

The present invention relates to polymeric optical/electronic devices, such as light-emissive devices and photovoltaic or photodetecting devices, and to a method of producing the same.

2. Description of the Related Art

Polymeric optoelectronic devices typically comprise a layer of optoelectronically active polymer material provided between electrodes such that charge carriers may move between the electrodes and the optoelectronically active material. Light-emissive devices operate by, charge carriers injected from the electrodes combining and decaying within the polymer material by a process that results in the emission of light. Photovoltaic devices operate by the creation of charge carrier pairs within the polymer material upon the incidence of light thereon, the separation of the carrier pairs and the migration of the charge carriers to the respective electrodes creating a potential between the electrodes. Photodetectors operate on the same basic principle as that of a photovoltaic device except that a current induced in an external circuit proportional to the intensity of the incident light is the desired output and often they are included in circuits where they are essentially shorted-circuited (electrode to electrode) or an external bias is applied across the device to increase the 'detection efficiency'.

It is known to provide polymeric charge transport layers between the optoelectronically active layer and one or both of the electrodes to facilitate the movement of the charge carriers between the electrodes and the optoelectronically active material.

SUMMARY

It is an aim of the present invention to provide useful optoelectronic device structures, and a method for producing the same.

According to a first aspect of the present invention, there is provided a light-emissive device comprising a light-emissive material provided between first and second electrodes such that charge carriers can move between the first and second electrodes and the light-emissive material, wherein the device includes a layer of a polymer blend provided between the first and second electrodes, phase separation of the polymer's in the polymer blend having been induced in at least a portion of the polymer blend so as to control the propagation of light emitted by the light-emissive material in a predetermined direction.

In one embodiment of this device, the phase separation of the polymers in the polymer blend has been induced in at least a portion of the polymer blend so as to control the propagation of light emitted by the light-emissive material in a direction between the first and second electrodes. In another embodiment, the phase separation of the polymers in the polymer blend having been induced in at least a portion of the polymer blend so as to control the propagation of light emitted by the light-emissive material in a direction parallel to the plane of the polymer blend layer.

There is also provided a method of producing a light-emissive device comprising a light-emissive material provided between first and second electrodes such that charge carriers can move between the first and second electrodes and the light-emissive material, the method comprising the steps of:

depositing a layer of a polymer blend in fluid form on a substrate comprising the first electrode, the polymer blend including the light-emissive material;

inducing phase separation in the polymer blend in a controlled manner so as to control, in use, the propagation of light emitted by the light-emissive material in a predetermined direction; and depositing the second electrode over the polymer blend layer.

According to a second aspect of the present invention, there is provided a device comprising a polymer blend layer that defines by means of phase separation of the polymers within the polymer blend two or more integrated optical and/or electronic components.

In one embodiment, the device comprises a light-emissive, first component and a light-guiding/modulating, second component for, in use, guiding light emitted from the light-emissive component in a predetermined direction, and/or to modulate light emitted from the light-emissive component, the first and second components defined within a single layer of a polymer blend by virtue of controlled phase separation of the polymers in the polymer blend. In another embodiment, the optoelectronic device comprises a photodetecting, first component and a light-guiding, second component for, in use, guiding light to the first component, the first and second components defined within a single layer of a polymer blend by virtue of controlled phase separation of the polymers in the polymer blend.

According to a third aspect of the present invention, there is provided a method of producing a controlled phase-separated polymer blend layer, the method comprising providing an organic substrate, modifying the surface energy of selected portions of the surface of the substrate by plasma treatment to pattern the organic surface of the substrate into areas having different surface energies, and depositing a polymer blend in fluid form onto the patterned substrate surface under conditions which allow phase separation of the polymer blend under the influence of the different surface energies.

There is also provided a method of producing a controlled phase-separated polymer blend layer, the method comprising providing an organic substrate, activating an organic surface of the substrate by plasma treatment, forming a counter layer on selected portions of the activated substrate surface to pattern the substrate surface into areas having different surface energies, and depositing a polymer blend in fluid form onto the patterned substrate surface under conditions which allow phase separation of the polymer blend under the influence of the different surface energies.

The counter layer serves to modify the surface energy of the portion of the substrate on which it is formed.

According to one variation of the method of producing a controlled phase-separated layer of a polymer blend including a first polymer and a second polymer, the method comprises the steps of forming on selected portions of the substrate surface a shielding layer of a material having different chemical affinities for the first and second polymers, and depositing the polymer blend in fluid form onto the patterned substrate surface under conditions which allow phase separation of the polymer blend under the influence of the different chemical affinities of the shielding layer for the first and second polymers.

When the method is used to prepare an optical, electronic, or optoelectronic device, the material and/or thickness of the shielding or counter layer are selected such that they do not substantially affect the basic function of the finished device. In the particular case of an optoelectronic or electronic device where the movement of charge carriers through the shielding or counter layer is required for the operation of the device, the material and/or thickness of the shielding or counter layer are selected such that the movement of charge carriers across the layer is not prevented under normal operating conditions.

According to a fourth aspect of the present invention, there is provided a polymeric optoelectronic device comprising a body provided between first and second electrode structures such that charge carriers can move between the body and the first and second electrode structures, wherein the body comprises a planar array of active regions in a non-active matrix, the array defined in a layer of a polymer blend by controlled phase separation of the polymer blend, and wherein the electrode structures are patterned such that, in use, each active region can be independently addressed.

According to a fifth aspect of the present invention, there is provided an optoelectronic device comprising a polymer blend layer having a first surface for receiving charge carriers of a first type and a second surface for receiving charge carriers of a second type, the polymer blend comprising an optoelectronically active, first polymer and a charge transport, second polymer, wherein the relative proportions of the first and second polymers varies within the polymer blend layer such that a portion of the polymer blend layer adjacent the first surface comprises a relatively high proportion of the second polymer to facilitate, in use, the reception of charge carriers into the polymer blend layer.

The polymer blend may additionally comprise a charge transport, third polymer, and wherein the relative proportion of the first, second and third polymers varies within the polymer blend layer such that a portion of the polymer blend layer adjacent the first surface comprises a relatively high proportion of the second polymer to facilitate, in use, the reception of charge carriers of the first type into the polymer blend layer, and such that a portion of the polymer blend layer adjacent the second surface comprises a relatively high proportion of the third polymer to facilitate, in use, the reception of charge carriers of the second type into the polymer blend layer.

The term "relatively high proportion" indicates that the respective portion of the polymer blend layer contains more of the respective polymer than the other portions of the polymer blend layer. It is preferred that each respective portion consists substantially of the respective polymer.

There is also provided a method of producing an optoelectronic device comprising a polymer blend layer provided between first and second electrical contacts, the polymer blend layer comprising an optoelectronically active, first polymer and a charge transport second polymer, the method comprising the steps of providing a substrate comprising the first electrical contact, depositing the polymer blend on a first surface of the substrate in a fluid form, solidifying the polymer blend, and forming the second contact over the solidified polymer blend layer, wherein the first surface of the substrate is selected to have a greater affinity towards the second polymer than the first polymer, and wherein the solidification of the polymer blend on the substrate is controlled such that the resulting polymer blend layer comprises a portion adjacent the first surface of the substrate having a relatively high proportion of the second polymer to facilitate, in use, the transport of charge between the first contact and the polymer blend layer.

In one embodiment of this method, the polymer blend layer comprises an optoelectronically active, first polymer, a charge transport second polymer, and a charge transport third polymer, wherein the first surface of the substrate is selected to have more affinity towards the second polymer than the first polymer, but less affinity to the third polymer than the first polymer, and wherein the solidification of the polymer blend on the substrate is controlled such that the resulting polymer blend layer comprises a first portion adjacent the first surface of the substrate having a relatively high proportion of the second polymer to facilitate, in use, the transport of charge between the first contact and the polymer blend layer, and a second portion opposite the first portion having a relatively high proportion of the third polymer to facilitate, in use, the transport of charge between the second contact and the polymer blend layer, the first and second portions being separated by a third portion having a relatively high proportion of the first polymer.

DESCRIPTION OF THE DRAWINGS

Embodiments of the present invention are described in more detail hereunder, by way of example only, with reference to the accompanying drawings, in which:—

DETAILED DESCRIPTION OF THE EXEMPLARY EMBODIMENTS

Figure 1:
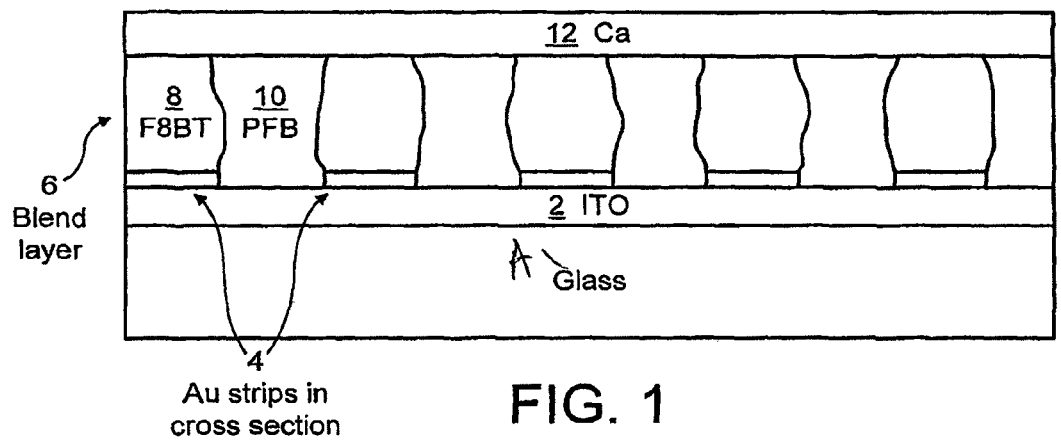
FIG. 1 is a schematic cross-sectional view of a light-emissive device according to an embodiment of the present invention.

FIG. 1 shows a schematic cross-sectional view of a light-emissive device according to a first embodiment of the present invention. An ITO-coated glass substrate 2 is provided with strips 4 of gold on the ITO coated surface thereof. A phase-separated blend 6 of F8BT ((poly(9,9'-dioctylfluorene-co-3,6-benzothiadiazole)) and PFB (poly(9,9'-dioctylfluorene-co-bis-N,N'-(4-butylphenyl)-bis-N,N'-phenyl-1,4-phenylenediamine) is provided on the substrate 2. by a solution-coating process The phase separation of the blend reflects the patterned substrate surface. Rows of a first phase 8 of predominantly F8BT are located above the relatively attractive gold strips and are separated from each other by rows of a second phase 10 predominantly of PFB located above the glass surface of the spaces between the gold strips. A layer of a low work function metal such as calcium 12 is provided on the phase-separated polymer blend layer.

In operation of the device, the ITO serves as an anode and the calcium layer 12 serves as a cathode. When a potential is applied across the device, charge carriers are injected into the polymer blend layer 6 from the anode and cathode, where they recombine and decay in a process that results in the emission of light. The patterning of the phase-separation of the polymer blend 6 affects the propagation of light in the layer and modifies the distribution of light emitted perpendicular and in the plane of the device.

This device may be produced according to the following method.

Figure 2:
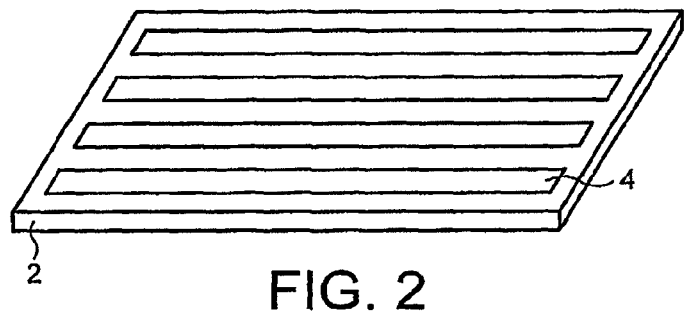
FIG. 2 is a schematic plan view of the device of FIG. 1 at an intermediate stage of its production.

A glass substrate is provided with a layer of evaporated layer of gold on one surface. A resist is patterned by exposure to UV radiation through a contact mask, baked and rinsed in a developing solution to produce a positive image of the desired pattern in resist on top of the gold. The substrate is then etched to remove the exposed gold and then the resist was removed. The gold thickness may range from hundreds of nanometers to approximately 20 nm The device at this stage of preparation is shown schematically in plan view in FIG. 2.

Alternatively, a patterned substrate may be produced by a soft lithography based self-assembled monolayer surface modification of a substrate provided with a layer of gold over its entire upper surface. The pattern may be produced from a silicone elastomer stamp with a physical grating on the stamping surface. The stamp is 'inked' with a $CH_3$— and fluorinated hydrocarbon-terminated thiol solution, dried and then placed in contact with the gold surface. The thiol ends of the ink molecules on the raised lines on the stamp, in contact with the surface, attach to the gold producing monolayer coverage of the gold in those areas. The width of the lines may be controlled to some degree by stamping pressure. This stamping step converts the stamped lines on the gold surface into hydrophobic regions. Subsequent to this hydrophobic patterning, the gold-coated substrate is then washed in a solution containg a COOH-terminated thiol. This results in the formation of a relatively hydrophilic surface on those gold areas not already covered by the hydrophobic monolayer, thus producing a substrate surface having relatively hydrophilic areas and relatively hydrophobic areas. The same end-terminated monolayer patterns can be created with other attachment chemistries. This includes silylation-based monolayers that can be used to produce hydrophobic/hydrophilic patterns on oxidized inorganic and organic surfaces.

Next a layer of a solution of a 1:1 (by weight) blend of F8BT:PFB (poly(9,9'-dioctylfluorene-co-bis-N,N'-(4-butylphenyl)-bis-N,N'-phenyl-1,4-phenylenediamine) is deposited on onto the patterned surface. This may be done, for example, by spin-coating or drop-casting of the polymer blend solution. The solution concentration was typically 15 grams of total polymer per liter of p-xylene for the spin-coating and 1-1.7 g/L for the drop casting solutions.

Other polymer blends, such as a 1:1 (by weight) F8BT:F8 (poly(9,9'-dioctylfluorene) blend, may be used provided the relative hydrophilicities of the constituent polymers are selected such that the blend may undergo controlled phase separation after deposition onto the patterned substrate surface. The film thickness of the polymer blend layer is in the range of 100-200 nm.

The blend ratio may be adjusted in accordance with the proportion of the hydrophilic surface area fraction on the patterned substrates.

The removal of the solvent from the layer of polymer blend solution on the patterned substrate surface is controlled such that the polymer blend has time to phase-separate in accordance with the pattern on the substrate surface. The rate of the solidification and phase-separation after dropping the solution onto the patterned substrates may be limited by covering the sample and a solvent reservoir with a glass dish, thereby slowing solvent evaporation from the sample. In some instances, the solutions may be spin-coated or drop cast under a solvent-enriched atmosphere onto the patterned substrate surface.

Fine pattern transfer (sub-micron) may also be achieved by a combination of spin-coating and annealing. A blend film is first spun onto the patterned substrate from a highly volatile solvent leading to a very fine, nanostructured phase separation that may not yet completely follow the substrate pattern through the depth of the film. Subsequent annealing steps, in the presence of a solvent vapor-enriched atmosphere, lead to further phase separation and conformity with the substrate pattern.

Finally, a layer of a low work function metal such as calcium is deposited on the phase-separated polymer blend layer by an evaporation technique.

Figure 10:
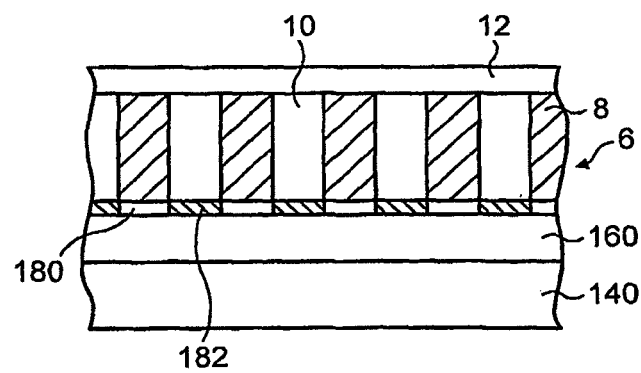
FIG. 10 is a schematic cross-sectional view of a light-emissive device according to another embodiment of the present invention.

In an alternative embodiment, the light-emitting device includes a layer of a hole transport polymer layer, such as PEDOT:PSS, between the polymer blend and the anode. PEDOT:PSS films are used in light-emitting diode structures to improve injection of holes from ITO anodes into a subsequent polymer layer. In this case, a patterned PEDOT:PSS-coated anode substrate may be produced as follows. First a PEDOT:PSS film 160 is formed on an oxygen plasma-treated ITO/glass substrate 140 by first spin-coating and heating (under dry nitrogen). Then, the PEDOT:PSS film 160 is treated in an oxygen plasma to facilitate the subsequent microcontact printing of self-assembled monolayers 180, 182 directly on the PEDOT:PSS surface. The microcontact printing and the remaining steps are then carried out, for example, as described above. Such a device is shown schematically in FIG. 10, in which like components are designated by identical reference numerals.

In an alternative technique, the plasma treatment itself can be used to pattern the PEDOT:PSS layer. In this technique, only selected areas of the PEDOT:PSS layer are subjected to the plasma treatment to create a pattern of relatively hydrophilic areas and relatively hydrophobic areas. In another alternative technique, only a single microcontact printing step is carried out to cover selected portions of the PEDOT:PSS layer, and differences in hydrophilicity between the microcontact printed areas and the uncovered PEDOT:PSS areas are used to induce the desired phase separation of the polymer blend.

Figure 3:
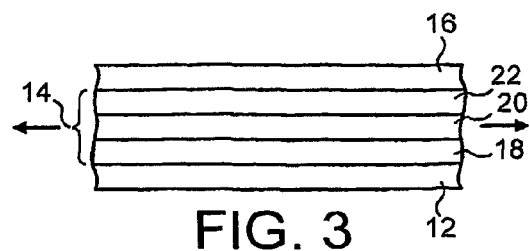
FIG. 3 is a schematic cross-sectional view of a light-emissive device according to another embodiment of the present invention.

FIG. 3 shows a schematic cross-sectional view of a light-emissive device according to an alternative embodiment of the present invention. A phase-separated polymer blend 14 is provided between an anode substrate 12 and a cathode 16. The polymer contains three semi-conductive conjugated polymers having differing hydrophilicities, at least one of which is a light-emissive polymer. The three polymers are selected such that the phase separation of the polymer blend can be controlled to produce the pattern shown in FIG. 3, in which a layer of a first phase 18 of predominantly a first of the three polymers lies adjacent the anode substrate 12, a layer of a second phase 20 of predominantly a second of the three polymers lies above the layer of the first phase 18, and a layer of a third phase 22 of predominantly a third of the three polymers lies above the layer of the second phase 20. In this embodiment, the anode substrate is provided with an upper surface 24 having a uniform hydrophilicity or hydrophobicity (the degree of hydrophilicity or hydrophobicity being selected so as to induce the desired phase separation in the polymer blend), a solution of the polymer blend is deposited on this surface 24, and the removal of the solvent is controlled to result in a patterned polymer blend layer as described above. In a preferred variation, the first polymer is a hole transport polymer to provide a hole transport layer adjacent the anode substrate, the third polymer is an electron transport polymer to provide an electron transport layer adjacent the cathode, and the second polymer is a light-emissive polymer to provide a light-emissive layer between the charge transport layers.

In operation, light is emitted by the light-emissive polymer when a suitable potential is applied across the electrodes, and the emitted light is guided in a direction substantially parallel to the layers of the device by the patterning of the phase-separated polymer blend.

Figure 4:
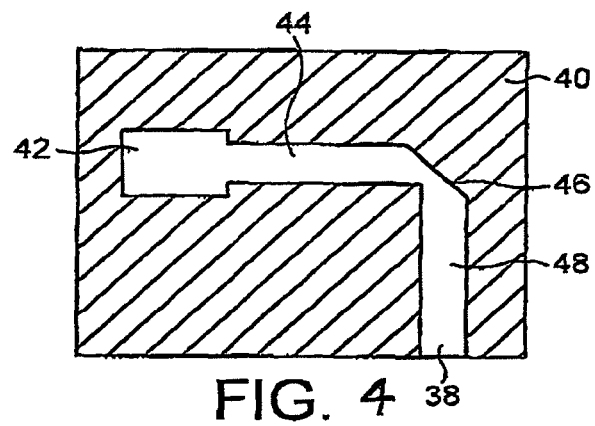
FIGS. 4 and 5 are schematic cross-sectional views of a light-emissive device according to another embodiment of the present invention.
Figure 5:
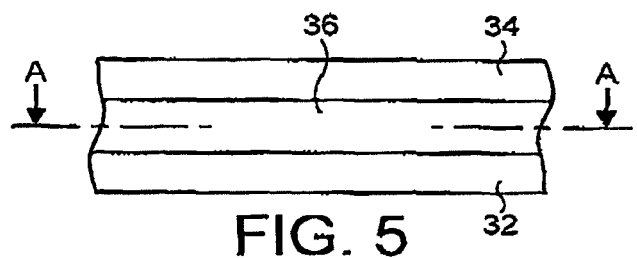

FIGS. 4 and 5 show schematic views of an optoelectronic device according to an alternative embodiment of the present invention. With reference to FIG. 5, the device comprises a polymer blend layer 36 between a patterned anode substrate 32 and a cathode 34. The anode substrate 32 is patterned so as to induce phase separation of the polymer blend in the manner shown in FIG. 4, which is a schematic view of a cross-section A-A. The phase separation of the polymer blend is controlled to produce a first region 38 of predominantly a first, optoelectronically active polymer and a second region 40 of predominantly a second, optoelectronically inactive polymer. The first region defines a light-emitting region 42 as a first component, a first waveguide 44 as a second component, a reflector 46 as a third component, and a second waveguide 48 as a fourth component. In operation, light emitted at the light-emitting region is guided out of the device in a predetermined direction by the waveguides and reflector. This device may be produced in the same general manner as the first embodiment shown in FIG. 1 except that the anode substrate is patterned in line with the pattern shown in FIG. 4 rather than in rows. The cathode 36 may be patterned such that only light is emitted at the light-emitting region 38.

Figure 6:
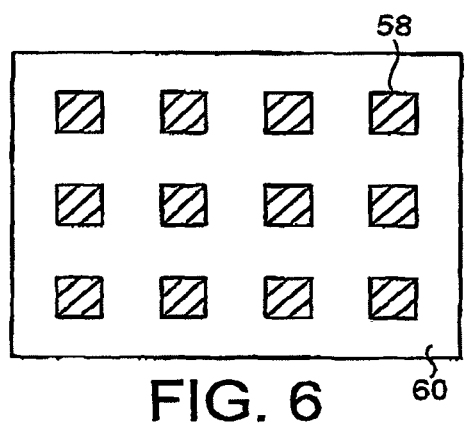
FIGS. 6 and 7 are schematic cross-sectional views of a light-emissive device according to another embodiment of the present invention.
Figure 7:
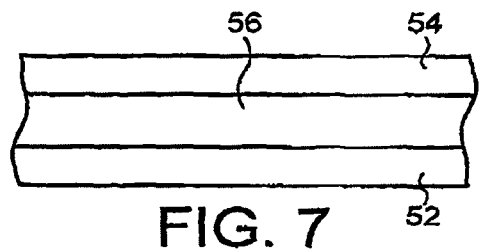

FIGS. 6 and 7 show schematic views of an alternative embodiment of a device according to the present invention. With reference to FIG. 7, a phase-separated polymer blend layer 56 is provided between an anode substrate 52 and a cathode 54. Phase separation of the polymer blend layer has been induced to produce a pattern of the kind shown in FIG. 6, in which a plurality of first regions 58 of predominantly a first, light-emissive polymer are surrounded by a second, matrix region 60 of predominantly a second, non-emissive polymer. This device may be made in the same general manner as the device shown in FIG. 1 except that the anode substrate is patterned to have, for example, a regular 2D array of relatively hydrophilic surfaces areas surrounded by a relatively hydrophobic surface area.

In operation, light is emitted only from the first, light-emissive regions 58 to thereby define a pixellated display. The cathode and/or anode may be patterned such that each of the light-emissive regions may be separately addressed.

Figure 8:
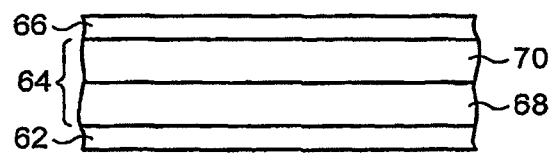
FIG. 8 is a schematic cross-sectional view of a light-emissive device according to another embodiment of the present invention.

FIG. 8 shows a schematic view of a device according to an alternative embodiment of the present invention. A phase-separated polymer blend 64 is provided between an anode substrate 62 and a cathode 66. The polymer contains two semi-conductive conjugated polymers having differing hydrophilicities, a first, light-emissive polymer and a second, hole transport polymer. The anode substrate is selected so as to induce a solution of the polymer blend deposited thereon to phase-separate in a manner as shown in FIG. 8, in which a first, hole transport layer 68 of predominantly the second polymer lies adjacent the anode substrate, and a second, light-emissive layer 70 of predominantly the first polymer lies over the first, hole transport layer.

Figure 9:
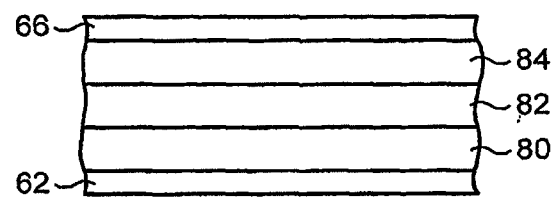
FIG. 9 is a schematic cross-sectional view of a light-emissive device according to another embodiment of the present invention.

In a variation shown in FIG. 9, the polymer blend contains three semi-conductive conjugated polymers having differing hydrophilicities, a first, hole transport polymer, a second, light-emissive polymer and a third, electron transport polymer. The three polymers are selected such that the phase separation of the polymer blend can be controlled to produce the pattern shown in FIG. 9, in which a first, hole transport layer of a first phase 80 of predominantly the first polymer lies adjacent the anode substrate 62, a second light-emissive layer of a second phase 82 of predominantly the second polymers lies above the layer of the first phase 80, and a third, electron transport layer of a third phase 84 of predominantly the third polymer lies above the layer of the second phase 82.

In the embodiments shown in FIGS. 8 and 9, the anode substrate is provided with an upper surface 24 having a uniform hydrophilicity or hydrophobicity, the degree of hydrophilicity or hydrophobicity being selected to induce the polymer blend to phase-separate in the desired manner. A solution of the polymer blend is deposited on this surface 24, and the removal of the solvent is controlled to result in a patterned polymer blend layer as described above.

The applicant draws attention to the fact that the present invention may include any feature or combination of features disclosed herein either implicitly or explicitly or any generalisation thereof, without limitation to the scope of any of the present claims. In view of the foregoing description it will be evident to a person skilled in the art that various modifications may be made within the scope of the invention.

What is claimed is:

1. A method of producing an optoelectronic device comprising a light-emissive material provided between first and second electrical contacts comprising a polymer blend layer, the polymer blend layer comprising an optoelectronically active, first polymer and a charge transport second polymer, the method comprising:

providing a substrate comprising the first electrical contact, depositing the polymer blend on a first surface of the substrate in a fluid form, solidifying the polymer blend, forming the second contact over the solidified polymer blend layer, modifying surface energy of selected portions of the first surface of the substrate by plasma treatment to pattern the first surface of the substrate into areas having different surface energies, and depositing the polymer blend layer onto the patterned substrate surface under conditions which allow phase separation of the polymer blend under the influence of the different surface energies, wherein the phase separation is induced in the polymer blend layer in a controlled manner so as to control, in use, a propagation of light emitted by the light-emissive material in a predetermined direction and the phase separation is a lateral phase separation in the planar direction of the polymer blend layer, wherein the first surface of the substrate is selected to have a greater affinity towards the second polymer than the first polymer, and wherein the solidification of the polymer blend on the substrate is controlled such that the resulting polymer blend layer comprises a portion adjacent to the first surface of the substrate having a relatively high proportion of the second polymer to facilitate, in use, transport of charge between the first contact and the polymer blend layer.

2. A method of producing an optoelectronic device according to claim 1, further comprising activating an organic surface of the substrate by plasma treatment, forming a counter layer on selected portions of the activated substrate surface to pattern the substrate surface into areas having different surface energies, and depositing the polymer blend layer onto the patterned substrate surface under conditions which allow phase separation of the polymer blend under the influence of the different surface energies.

3. A method according to claim 2, wherein the substrate is a polymeric substrate.

4. A method according to claim 1, wherein the optoelectronic device comprises a light-emissive device and the substrate further comprises an organic layer disposed over the first electrical contact; wherein the method further comprises modifying surface energy of selected portions of a surface of the organic layer to pattern the surface of the organic layer into areas having different surface energies; and wherein the polymer blend includes a light-emissive material and is deposited onto the patterned surface of the organic layer under conditions which allow phase separation of the polymer blend under the influence of the different surface energies.

5. A method according to claim 4, wherein the first electrical contact is an anode and the organic layer is a hole transport polymer layer.

6. A method according to claim 5, wherein the hole transport polymer layer comprises PEDOT:PSS.

7. A method according to claim 6, wherein plasma treatment is used in the modifying step.

8. A method according to claim 7, wherein microcontact printing is used in the modifying step.

9. A method of producing an optoelectronic device comprising a light-emissive material provided between first and second electrical contacts comprising a polymer blend layer, the polymer blend layer comprising an optoelectronically active, first polymer, a charge transport second polymer, and a charge transport third polymer, the method comprising:

providing a substrate comprising the first electrical contact, depositing the polymer blend on a first surface of the substrate in a fluid form, solidifying the polymer blend, forming the second contact over the solidified polymer blend layer, modifying surface energy of selected portions of the first surface of the substrate by plasma treatment to pattern the first surface of the substrate into areas having different surface energies, and depositing the polymer blend layer onto the patterned substrate surface under conditions which allow phase separation of the polymer blend under the influence of the different surface energies, wherein the phase separation is induced in the polymer blend layer in a controlled manner so as to control, in use, a propagation of light emitted by the light-emissive material in a predetermined direction and the phase separation is a lateral phase separation in the planar direction of the polymer blend layer, wherein the first surface of the substrate is selected to have more affinity towards the second polymer than the first polymer, but less affinity to the third polymer than the first polymer, and wherein the solidification of the polymer blend on the substrate is controlled such that the resulting polymer blend layer comprises a first portion adjacent to the first surface of the substrate having a relatively high proportion of the second polymer to facilitate, in use, a transport of charge between the first contact and the polymer blend layer, and a second portion opposite the first portion having a relatively high proportion of the third polymer to facilitate, in use, a transport of charge between the second contact and the polymer blend layer, the first and second portions being separated by a third portion having a relatively high proportion of the first polymer.

\* \* \* \* \*